US008643368B2

(12) United States Patent
Sun et al.

(10) Patent No.: US 8,643,368 B2
(45) Date of Patent: Feb. 4, 2014

(54) SYSTEMS AND METHODS FOR DESIGN AND CONSTRUCTION OF NMR TRANSCEIVER CIRCUITS

(75) Inventors: Nan Sun, Cambridge, MA (US); Donhee Ham, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 467 days.

(21) Appl. No.: 12/919,215

(22) PCT Filed: Feb. 25, 2009

(86) PCT No.: PCT/US2009/001206
§ 371 (c)(1),
(2), (4) Date: Nov. 15, 2010

(87) PCT Pub. No.: WO2009/108326
PCT Pub. Date: Sep. 3, 2009

(65) Prior Publication Data
US 2011/0057654 A1    Mar. 10, 2011

Related U.S. Application Data

(60) Provisional application No. 61/031,180, filed on Feb. 25, 2008.

(51) Int. Cl.
*G01R 33/44* (2006.01)
(52) U.S. Cl.
USPC ........... 324/318; 324/307; 324/309; 324/320; 600/407; 600/410

(58) Field of Classification Search
USPC ............ 324/300–322; 600/407–410; 336/200
See application file for complete search history.

(56) References Cited

U.S. PATENT DOCUMENTS

| 6,100,687 | A  | * | 8/2000 | Weitekamp et al. | 324/300 |
| 2003/0206013 | A1 | * | 11/2003 | Wu et al. | 324/307 |
| 2005/0275497 | A1 | * | 12/2005 | Ramadan et al. | 336/200 |
| 2007/0279058 | A1 | * | 12/2007 | Bulkes et al. | 324/314 |

* cited by examiner

*Primary Examiner* — Melissa Koval
*Assistant Examiner* — Rishi Patel
(74) *Attorney, Agent, or Firm* — Ezliabeth Kim Patent Law Offices LLC (57) ABSTRACT

The Rabi frequency of oscillation of the nuclear magnetization vector of a sample in an NMR system may be controlled by modifying only the duty cycle of RF pulses delivered to the sample, without modifying the amplitude of the RF pulses, until the energy delivered at the Larmor frequency is adjusted to a desired amount. An impedance matching network between an NMR transceiver and an NMR coil may perform both power matching and noise matching simultaneously. During a transmission mode, the impedance matching network is connected to a transmitter portion of the transceiver, and the impedance of the coil is matched to the driver resistance. During a receiver mode, the impedance matching network is disconnected from the transmitter portion so that the impedance matching network remains connected only to the receiver portion, and signal-to-noise ratio in received NMR signals is maximized.

9 Claims, 9 Drawing Sheets

SYSTEMS AND METHODS FOR DESIGN AND CONSTRUCTION OF NMR TRANSCEIVER CIRCUITS

CROSS-REFERENCE TO RELATED APPLICATIONS

This application is based upon, and claims the benefit of priority under 35 U.S.C. §119(e) from U.S. Provisional Patent Application Ser. No. 61/031,180 (the "'180 provisional application"), filed Feb. 25, 2008, entitled "NMR Transceiver Circuit Techniques." The content of the '180 provisional application is incorporated herein by reference in its entirety as though fully set forth.

STATEMENT REGARDING FEDERALLY SPONSORED RESEARCH

This invention was made with government support under grant NSF/PHY 06-46094, awarded by the National Science Foundation. The government has certain rights in the invention.

BACKGROUND

NMR (nuclear magnetic resonance) is a well known analytic technique that is based on the interactions between nuclear spins, and static and time varying external magnetic fields. NMR is useful in a number of fields, including but not limited to spectroscopy, biosensing, and medical imaging.

Significant efforts have been devoted to miniaturize NMR systems, in particular NMR transceivers. The numerous advantages of miniaturization include low cost, portability, and the fact that a microcoil tightly surrounding a small size sample increases the signal quality.

The practical design and construction of miniaturized NMR transceiver circuits may present a number of challenges. For example, on-chip integration of the PA (power amplifier) may be challenging, because of high linearity and large slew-rate among other things. It may also be challenging to efficiently and optimally achieve power matching for the transmitter portion of the NMR transceiver and noise matching for the receiver portion of the NMR transceiver.

SUMMARY

In one embodiment, of the present disclosure, the Rabi frequency of oscillation of a net magnetization vector of nuclei, within a sample that is being analyzed by an NMR system, may be controlled by modifying only the duty cycle of RF (radio frequency) pulses delivered to the sample, and not modifying the amplitude of the RF pulses. The duty cycle of the RF pulses may be adjusted in this manner until the energy delivered by the RF pulses at the Larmor frequency of the sample is adjusted to a desired amount.

In one embodiment of the present disclosure, simultaneous power matching and noise matching may be performed by an impedance matching network that interlaces an NMR transceiver to an NMR coil. During a transmission mode of the NMR transceiver, the impedance matching network is connected to the transmitter portion, and She impedance of the coil is matched to the driver resistance of the NMR transceiver. During a receiver mode of the NMR transceiver, the impedance matching network is disconnected from the transmitter portion so that the impedance matching network remains connected only to the receiver portion, then signal to noise ratio in a received NMR signal is maximized.

BRIEF DESCRIPTION OF DRAWINGS

The figures depict one or more implementations in accordance with the present disclosure, by way of example only and not by way of limitations. The drawings disclose illustrative embodiments. They do not set forth all embodiments. Other embodiments may be used in addition or instead. In the figures, like reference numerals refer to the same or similar elements.

DESCRIPTION

In the present disclosure, systems and methods are described for designing and constructing NMR transceiver circuits. These techniques may be used in any NMR system, and may be especially useful in integrated NMR transceivers. Features and components discussed below may also be applied to spin systems other than NMR systems, including but not limited to ESR (electron spin resonance) systems.

As mentioned in the background section, the phenomenon of nuclear magnetic resonance is based on the interactions between nuclear spins and static and time varying external magnetic fields. Nuclei with a net spin have magnetic moments parallel to the spin axis. When a sample composed of these nuclei is placed in a static external magnetic field $B_0$, the nuclear magnetic moments precess about the axis of the field $B_0$ at a frequency $\omega_0$ called Larmor frequency, which depends only on the magnitude of the static field $B_0$, and a proportionality constant $\gamma$ called the gyromagnetic ratio: $\omega_0 = \gamma B_0$. The Larmor frequency reveals the sample material's chemical composition, as the gyromagnetic ratio $\gamma$ assumes different values for different nuclei.

Among all the nuclear magnetic moments in the sample, a slightly greater number of nuclear magnetic moments align themselves parallel to the field $B_0$, as opposed to aligning themselves anti-parallel to the field, at thermal equilibrium. This is because the spin state parallel to the $B_0$ field is the lower energy state. As a result, the magnetic moments of all the nuclei in the sample sum up to a net magnetization vector M. In order to observe precession of the magnetization vector M about $B_0$, another magnetic field $B_1$ is applied, which is time-dependent and transverse to $B_0$. The frequency of the $B_1$ field is matched to the Larmor frequency $\omega_0$.

Typically, $B_1$ may be generated by sending one or more short pulses of an RF signal into the coils which surround the sample in the probe. This excites the magnetization vector M into a non-equilibrium state in which it is no longer aligned with the static field. Once the RF excitation field is removed, the excited nuclei process about the axis of the field $B_0$, while relaxing through relaxation processes such as spin-spin relaxation.

Duty Cycle Modulation Only for Easy On-Chip Integration of Power Amplifier

Figure 1A:
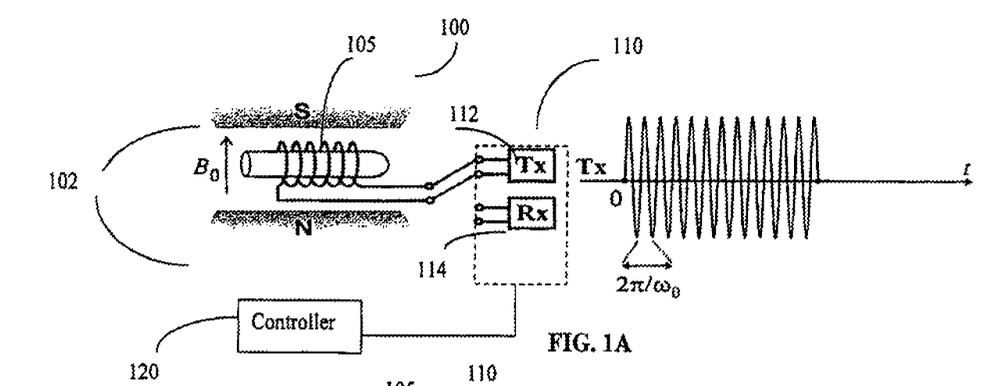
FIGS. 1A and 1B illustrate components of an NMR system.
Figure 1B:
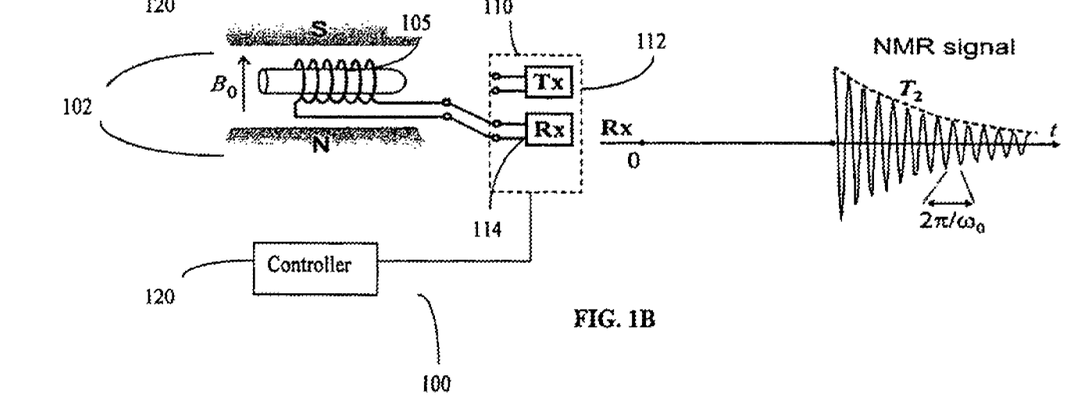

FIGS. 1A and 1B of this disclosure illustrates basic components of an NMR system 100. In one embodiment, the basic components of the NMR system 100 may include: 1) an NMR coil 105 that surrounds a sample being analyzed; 2) an NMR RF transceiver 110 coupled to the NMR coil 105; 3) a controller 120 that controls the operation of the NMR RF transceiver 110; and 4) a magnet 102 configured to generate a static magnetic field $B_0$ across the sample and the coil 105. The NMR transceiver 110 is shown in FIGS. 1A and 1B as including an NMR transmitter (commonly denoted as Tx) 112 and an NMR receiver (commonly denoted as Rx) 114. The NMR transmitter 112 typically includes an RF pulse generator configured to generate RF pulses.

When an RF signal at the Larmor frequency $\omega_0$ is transmitted by the transmitter 112 to the coil 105, as shown in FIG. 1A, the RF magnetic field produced by the coil resonantly excites nuclei spins within the sample. The RF excitation is stopped after a certain time by switching the coil 105 to the receiver 114, after which the nuclear spins precess about the $B_0$-axis at the frequency $\omega_0$. The nuclear spins slowly losing phase coherence via spin-spin interactions, which manifest themselves on a macroscopic average as an exponential relaxation or damping in the precession of the net magnetic moment. During this precession & relaxation, the coil 105 picks up a damped sinusoid, i.e. the NMR signal. This is shown in FIG. 1B. The relaxation's characteristic time, commonly referred to as $T_2$, is material specific, since spin-spin interactions are peculiar to the given material of the sample being tested. By measuring the Larmor frequency $\omega_0$ described above (e.g. for spectroscopy) and $T_2$ (e.g. for relaxometry), NMR techniques can be used as an analytic tool in a number of fields, including but not limited to chemical composition analysis, medical imaging, and bio-sensing.

Examples of integrated NMR transceiver systems may be found for example in G. Boero, J. Frounchi, B. Furrer, P. A. Besse, and R. S. Popovic, "Fully Integrated Probe For Proton Nuclear Magnetic Resonance Magnetometry," *Rev. Sci. Instr.* Vol. 72, No. 6, (June 2001). A miniaturized NMR system with an integrated CMOS RF transceiver is described for example in Yong Liu, Nan Sun, Hakho Lee, Ralph Weissleder, and Donhee Ham, "CMOS mini nuclear magnetic resonance system and its application for biomolecular sensing;" *IEEE International Solid-Slate Circuits Conference (ISSCC) Digest of Technical Papers*, pp. 140-141, February 2008 (henceforth referred to as "CMOS reference"). The disclosures of both papers in their entireties are hereby incorporated by reference in this application.

Figure 2:
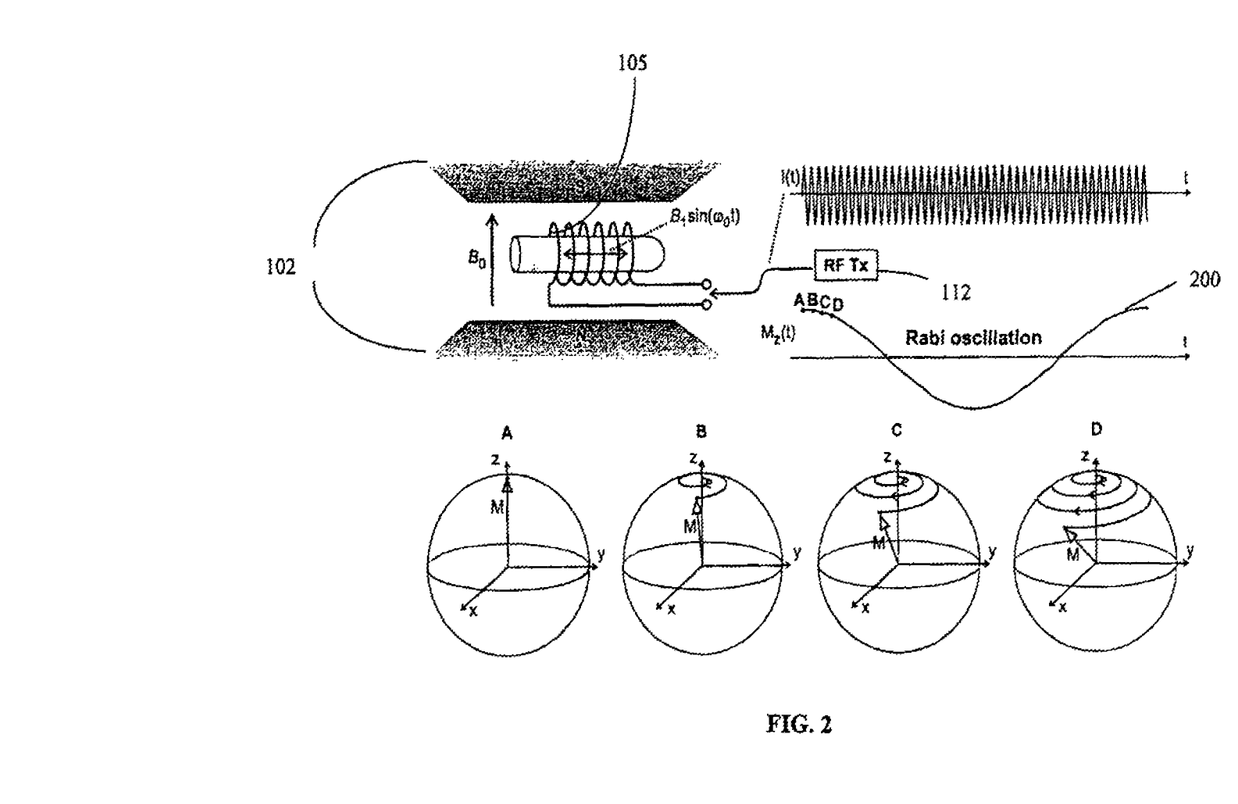
FIG. 2 illustrates Rabi oscillation of the nuclear magnetization vector M of a sample analyzed by an NMR system.

FIG. 2 illustrates Rabi oscillation of the nuclear magnetization vector M of a sample analyzed by the NMR system 100. As illustrated in FIG. 2, the Rabi frequency, i.e. the frequency of the Rabi oscillation, characterizes the rate at which the net magnetization vector M of a sample analyzed by the NMR system 100 processes about the effective field (sum of $B_0$ and the oscillating $B_1$ field, as seen in a rotating frame of reference). Rabi oscillation is illustrated in FIG. 2 by a curve 200. FIG. 2 also illustrates the position of the magnetization vector M at various stages (indicated in FIG. 2 as A, B, C, and D) of the Rabi oscillation, as M processes about the effective field.

To set the Rabi oscillation frequency right, i.e. to make sure that the right amount of energy is delivered to the NMR coil 105 at the Larmor frequency so as to cause the magnetization vector M to rotate by precisely 90° onto the xy-plane during the first quarter portion (0° to 90°) of the Rabi oscillation, it is conventional to modulate both the amplitude and duration of the RF pulse are modulated.

To control the amplitude of the RF pulses, a variable gain power amplifier is needed. The variable gain power amplifier is difficult to implement, however. In particular, it is difficult to integrate the variable gain power amplifier onto an IC chip. This is because a power amplifier is needed that is both adjustable, and also can generate a very high output power energy. High linearity and high slew rate of the variable gain power amplifier makes it difficult for the PA to be implemented, and in particular makes it extremely difficult for the PA to be integrated onto a chip.

Modifying both the amplitude and duration of the RF pulse makes it difficult to design the PA that amplifies the pulses from the RF pulse generator, especially in an integrated NMR transceiver.

In the present disclosure, methods and systems are disclosed for adjusting the energy associated with the RF pulse train without adjusting the amplitude of the pulses, as was conventionally done for such a purpose.

Figure 3:
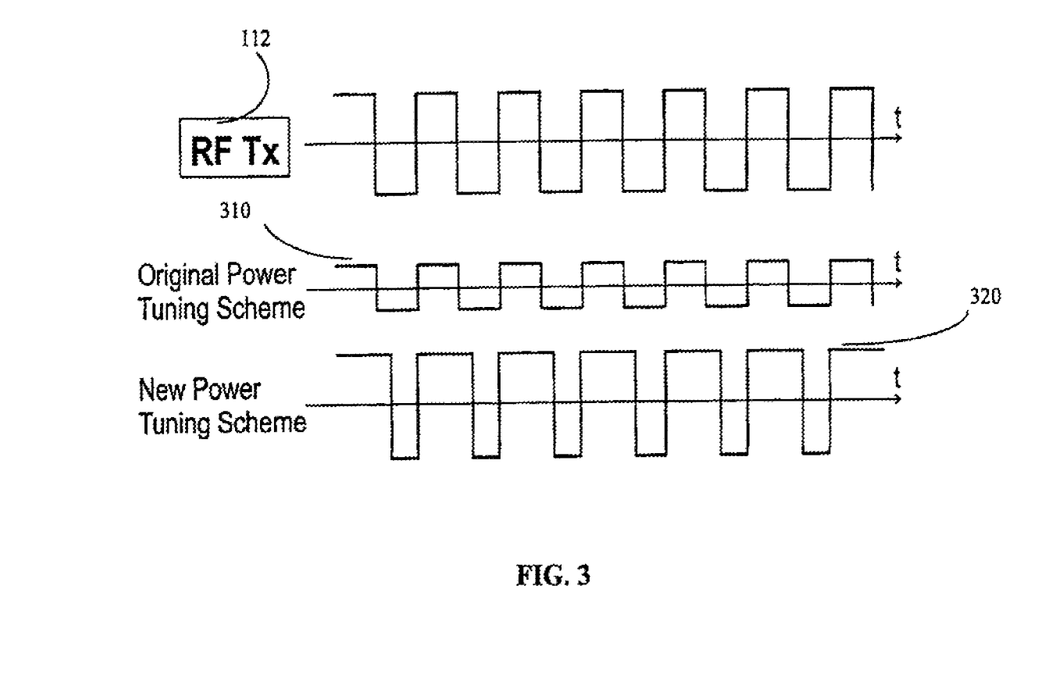
FIG. 3 illustrates a power tuning scheme in which only the pulse width or duty cycle of the RF pulses is modified, but not the amplitude.

FIG. 3 of the present disclosure illustrates one embodiment of the above-described power tuning scheme, shown by a curve 320 in the third row in FIG. 3. As seen by the curve 320, in this embodiment only the pulse width, i.e. duty cycle, of the RF pulses is modified, but the amplitudes of the RF pulses are not modified. Unlike the conventional power tuning scheme, illustrated with a curve 310 (shown in the second row of FIG. 3), the amplitudes of the RF pulses generated by an RF generator in the NMR transmitter 112 remain the same, and are not modulated.

The above described technique exploits the fact that the NMR system itself works like a very high Q band pass filter, since the RF signal must be sent exactly at the Larmor frequency other frequencies won't work for purposes of generating a detectable NMR signal. Therefore, an arbitrary signal can be sent, as long as the energy at that frequency has the desired value. By tuning the duty cycle, the energy can be adjusted at that frequency.

Because the amplitudes of the RF pulses need not be modulated, the implementation of the variable gain power amplifier (for the RF pulses), and in particular the on-chip integration of the variable gain power amplifier is made much easier.

In the illustrated embodiment, a method for controlling the Rabi frequency of oscillation of the magnetization vector (of nuclei in a sample analyzed by an NMR system) includes modifying the duty cycle of the RF pulses generated by the NMR transmitter but not the amplitude of the RF pulses. The method may include adjusting the duty cycle of the RF pulses until the energy delivered by the RF pulses at the Larmor frequency of the sample is adjusted to a desired amount.

In one embodiment of the present disclosure, the controller 120 (illustrated in FIGS. 1A and 1B) may be configured to modify the duty cycle but not the amplitude of the RF pulses generated by an RF pulse generator within the NMR transmitter 112. The controller 120 may be further configured to adjust the duty cycle of the RF pulses until the energy delivered by the RF pulses at a Larmor frequency of the sample is adjusted to a desired amount.

The method illustrated in FIG. 3 may be generalized to control the frequency of Rabi oscillation of any variable measurable by a spin system, not just the magnetization vector of nuclei in a sample analyzed by an NMR system. The spin system may be a two-state spin system, such as an NMR system or an ESR (electron, spin resonance) system, for example. The spin system may include an excitation field generator configured to generate excitation radiation that causes the Rabi oscillation.

The generalized method of controlling the Rabi frequency may include modifying the duty cycle of the excitation radiation (that causes the Rabi oscillation) while not modifying the amplitude of the excitation radiation, thereby adjusting the energy delivered by the excitation radiation to a desired amount.

In the present disclosure, a method is described for implementing a variable gain power amplifier in an NMR system, for example on-chip integrating the variable gain power amplifier in a miniaturized NMR system. The method may include modifying the duty cycle of the RF pulses generated by the NMR transmitter while not modifying the amplitude(s) of the RF pulses, until the energy delivered by the RF pulses at the Larmor frequency for the sample being analyzed by the NMR system is adjusted to a desired amount. Because the amplitudes of the RF pulses are not modulated, implementation (and in particular, on-chip integration) of the variable gain power amplifier is made easier. Typically, the NMR transmitter and the NMR receiver may be part of a single NMR transceiver.

In some embodiments, a computer-usable medium may be used to implement methods and systems described above. The computer-usable medium may have stored therein computer-usable instructions for the controller 120, which may be part, of the NMR system 100 (as shown in FIGS. 1A and 1B), or may be coupled thereto. The controller 120 may include, or may consist of, a processing system or computer.

The computer-usable instructions, when executed by the processing system, may cause the processing system to: 1) receive RF pulses from an RF pulse generator in the NMR system 100; 2) modify the duty cycle of the RF pulses generated by the RF pulse generator, while not modifying the amplitude(s) of the RF pulses, until the energy delivered by the RF pulses at the Larmor frequency for the sample being analyzed by the NMR system is adjusted to a desired amount.

Simultaneous Power and Noise Matching

Power matching and noise matching are typically implemented through an impedance matching network. One of the challenges in the design and optimization of NMR transceiver circuits is to design an impedance matching network that can achieve optimal power matching during the transmission mode and optimal noise matching during the receiver mode.

Figure 4:
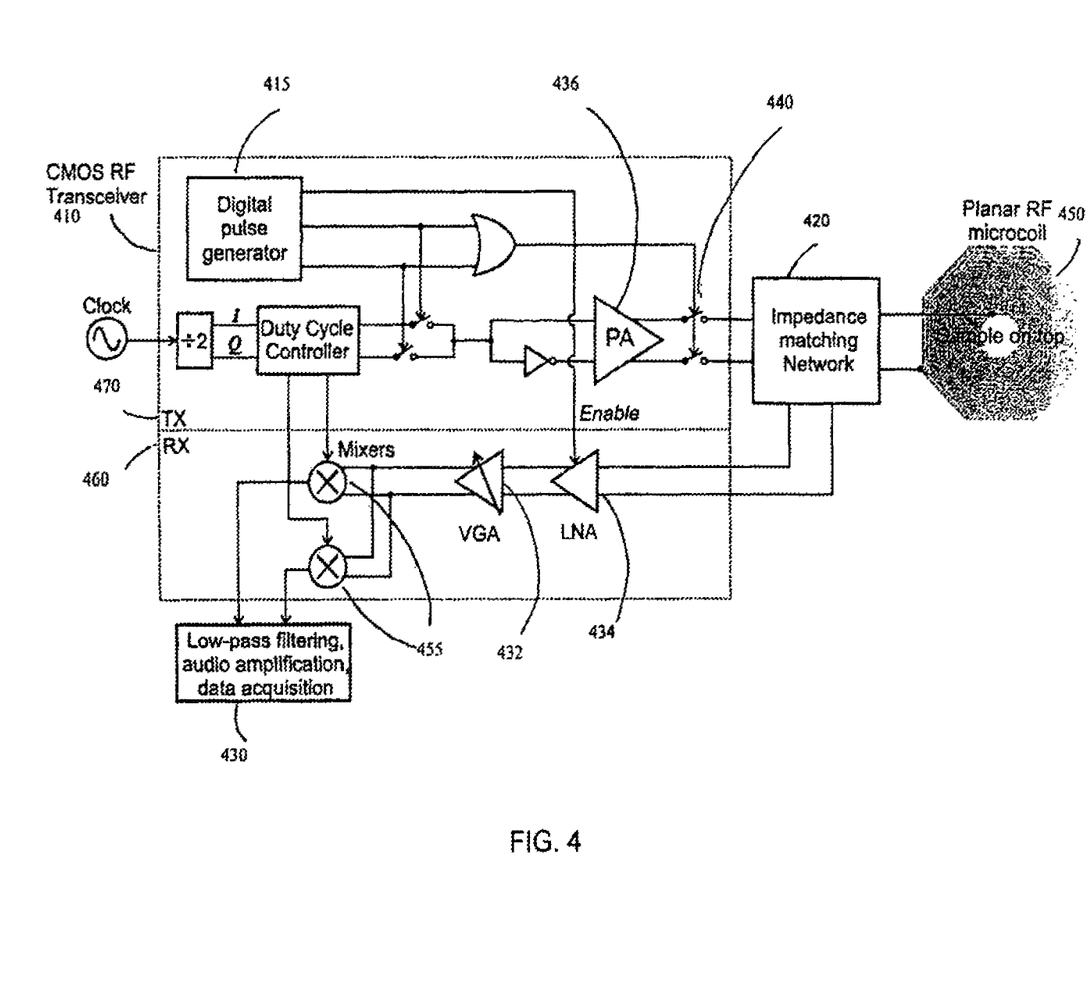
FIG. 4 illustrates a CMOS (complementary metal oxide semiconductor) NMR transceiver coupled to an NMR coil by an impedance matching network, in accordance with one embodiment of the present disclosure.

FIG. 4 illustrates a CMOS (complementary metal oxide semiconductor) NMR transceiver 410 coupled to an NMR coil 450 by an impedance matching network 420. In the illustrated, embodiment, the NMR transceiver 410 is integrated in a CMOS IC (integrated chip) shown in FIG. 4 within a dashed box. The NMR transceiver 410 and the NMR coil 450 are interfaced via the impedance matching network 420.

Circuit components with the illustrated embodiment of the CMOS IC 410 include a pulse generator 415, mixers 455, a PA 436, a LNA (low noise amplifier) 434, and a VGA (variable gain amplifier) 432. Also included is a switch 440 between the PA 436 and the impedance matching network 420. This switch can be turned on to connect the impedance matching network 420 to the transmitter portion 460, or turned off to disconnect the impedance matching network 420 from the transmitter portion 460. The LNA 434 and the VGA 432 in FIG. 4 are very important for receiver sensitivity.

In one embodiment the receiver portion 460 may be a fully differential, heterodyning receiver, and the mixers 455 may be Gilbert mixers. As commonly done in NMR systems, the frequency of the local oscillator (generating quadrature signals shown within the IC 410 as I and Q) for heterodyning is tuned slightly off from the NMR frequency. As also common in NMR systems, the same I and Q signals used in the receiver portion 470 are used as RF excitation signals in the transmitter portion 460 in FIG. 4. The slightly-off excitation frequency is close enough to resonantly excite nuclear spins within the sample. In one embodiment, the sample may include hydrogen atoms whose nuclei are protons, and the Larmor frequency of the sample may be about 21.3 MHz times $2\pi$. In one embodiment, the RF signals may be transmitted in a Carr-Purcell sequence gated by the digital pulse generator 415.

Further details of the circuitry of the CMOS NMR transceiver 410, including but not limited to schematics for the LNA 434 and VGA 432, may be found in the CMOS reference, discussed in paragraph [028] above and incorporated by reference in its entirety.

Figure 5:
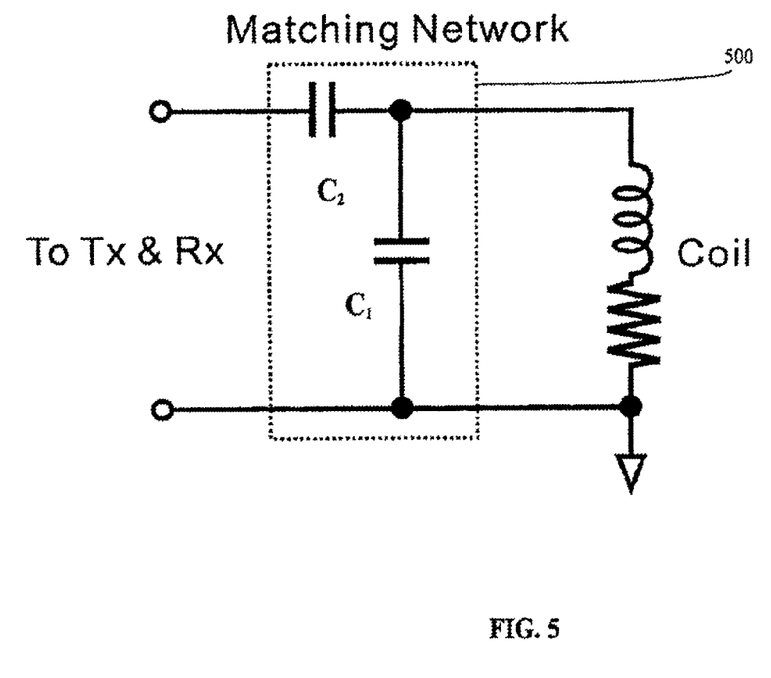
FIG. 5 of illustrates a conventional impedance matching network between an NMR transceiver and an NMR coil.

FIG. 5 of the present disclosure illustrates a conventional impedance matching circuit/network 500 that interfaces an NMR transceiver with an NMR coil. As seen in FIG. 5, this conventional impedance matching circuit includes variable (or adjustable) capacitors (shown C1 and C2 that are connected in such a way that the values of these capacitors can be adjusted to optimize the power transfer to the NMR transceiver.

Because the NMR signal emanating from the NMR coil is very small, the SNR (signal to noise ratio) is a critical parameter, in order to detect NMR signals of high quality, it is important that the RF coil, which typically looks like an 50Ω load to the amplifier and receiver, be accurately and optimally matched.

Power matching for the transmitter Tx matches the impedance of the NMR coil to optimize power transfer between the NMR coil and the Tx, so that the spins can be optimally excited. Noise matching for the receiver Rx seeks to minimize noise figure (the ratio of the signal to noise ratio at the input of the LNA to the signal to noise ratio at the output of the LNA) so that the SNR (signal to noise ratio) of the received NMR signal at the output of the LNA can be maximized.

In the present disclosure, methods and systems are described for implementing impedance matching networks that allow for very effective excitation of spins in the NMR transmitter during the transmission mode, and for very sensitive reception of the NMR signal in the NMR receiver.

Figure 6:
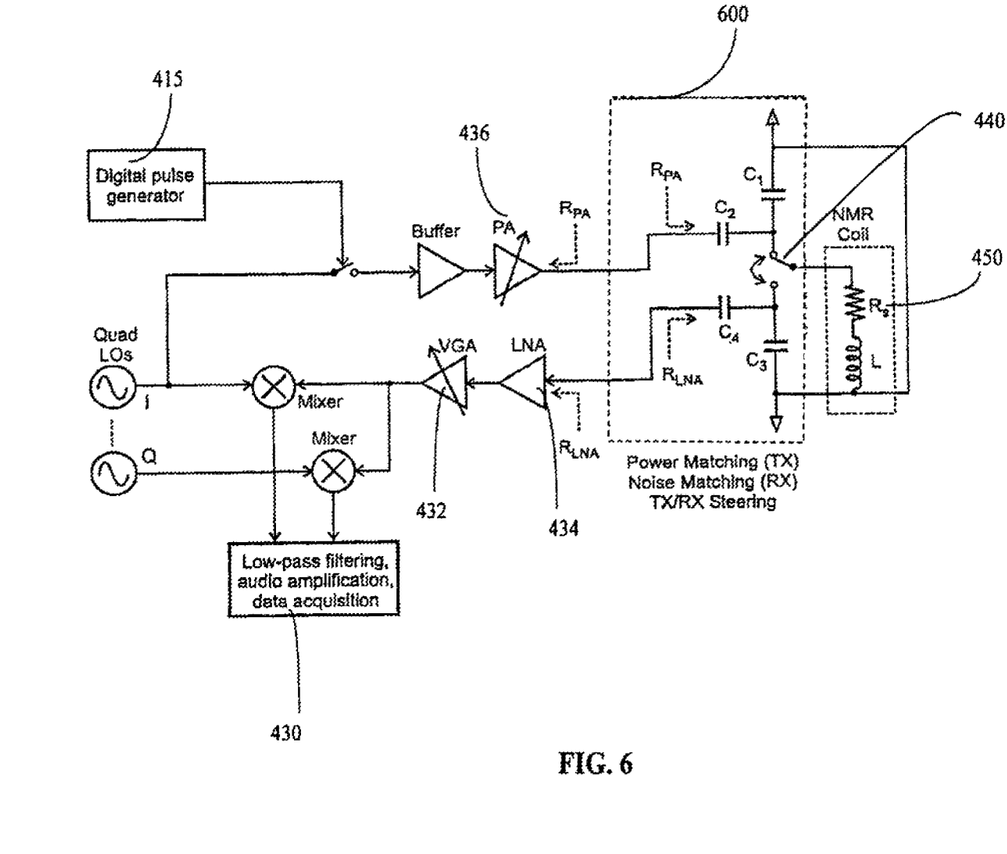
FIG. 6 illustrates the use of two passive networks for performing receiver noise matching during the receiving mode, and transmitter power matching during the transmission mode, in accordance with one embodiment of the present disclosure.

FIG. 6 illustrates one embodiment of the present disclosure, in which two networks are used to perform receiver noise matching during the receiving mode, and transmitter power matching during the transmission mode, respectively. In the embodiment illustrated in FIG. 6, two networks are arranged separately, so that the coil is switched to the LNA through the noise matching network during the receiving mode, and to the PA through the power matching network during the transmission mode.

As seen in FIG. 6, during the transmission mode, i.e. when the NMR coil 450 is being driven, the matching network 600 is connected to the variable gain PA 436. The NMR coil 450 is connected to C1 and C2, which are adjusted so as to match the coil impedance to the driver resistance. During the Rx mode, i.e. during reception of the signal from the NMR coil, the matching network 600 is connected to the LNA 434 (which amplifies the received signal), and disconnected from the Tx portion that includes the coil driver, i.e. the RF signal generator and clock. The driving path is now open or floating, and the coil 450 is at resonance. The NMR coil 450 is connected to C3 and C4, which are adjusted to perform noise matching.

In the illustrated embodiment, a switch 440 is used to connect, during the transmitter mode of the NMR transceiver, the impedance matching network 600 to the PA 436 in the transmitter portion of the NMR transceiver so that the coil impedance can be matched to the driver resistance during the transmitter mode. The switch 440 is further used to connect, during the receiver mode of the NMR transceiver, the impedance matching network 600 to the LNA 434 in the receive portion of the NMR transceiver and disconnecting the impedance matching network 600 from the transmitter portion of the NMR transceiver so that the driving path is now open or floating. Circuit elements other than a switch may also be used, in different embodiments of the present disclosure.

The impedance matching network 600 may be coupled to, or may include, a microcontroller or microprocessing system (not shown), which inter alia may be configured to: adjust the first and second capacitors (C1 and C2) during the transmitter mode so as to match the coil impedance to the driver resistance, and adjust the third and fourth capacitors (C3 and C4) during the receiver mode so as to minimize input noise.

In the illustrated embodiment, a method for performing power matching and noise matching in an NMR system includes providing, to an impedance matching network, two separate connections to the transmitter portion and the receiver portion, respectively, of the NMR transceiver, thereby separating the driving of the NMR coil from the receiving path through which the NMR signal generated in the NMR coil is received by the receiver portion of the NMR transceiver.

The method may further include the act of connecting, while driving the NMR coil, the impedance matching network to the transmitter portion of the NMR transceiver, and adjusting one or more adjustable capacitors in the impedance matching network so as to match the coil impedance to the driver resistance. The method may further include the act of connecting, while the NMR signal is being received from the NMR coil, the impedance matching network to the receiver portion of the NMR transceiver, and disconnecting the impedance matching network from the transmitter portion of the NMR transceiver, so that the driving path is now open or floating, and the coil is at resonance. The method may further include the act of adjusting one or more adjustable capacitors in the impedance matching network so as to perform noise matching for the NMR transceiver.

In the embodiment illustrated in FIG. 6, some loss in signal-to-noise ratio may be associated with the switch, since in the receiving mode, the turn-on loss of the switch will directly translate to noise figure.

Figure 7:
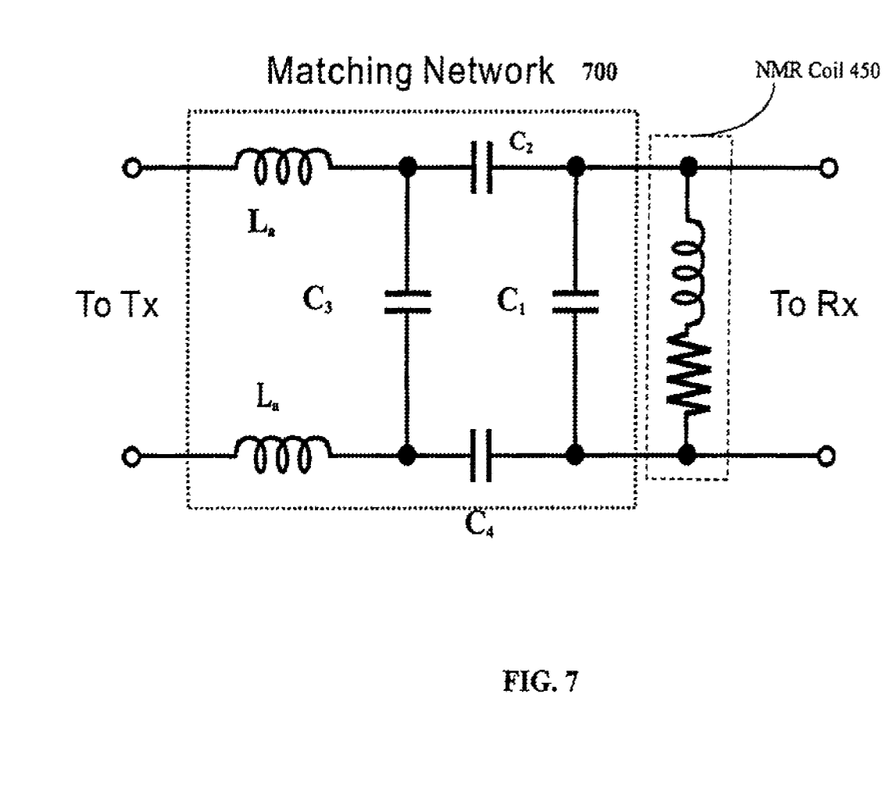
FIG. 7 illustrates an impedance matching network between an NMR transceiver and an NMR coil, in accordance with one embodiment of the present disclosure.

FIG. 7 illustrates a differential impedance matching network 700, in accordance with another embodiment of the present disclosure, which obviates the need for using a switch in the receiving mode, while allowing for simultaneous power matching (during the transmitter mode) and noise matching (during the receiver mode).

The impedance matching network 700 illustrated in FIG. 7 includes a first adjustable capacitor C1 connected in parallel with the NMR coil 450 and a second adjustable capacitor C2. The impedance matching network 700 further includes a third adjustable capacitor C3 and a fourth adjustable capacitor C4. In the illustrated embodiment, the matching network 700 further includes two adjustable inductors $L_a$, connected as shown in FIG. 7.

Figure 8A:
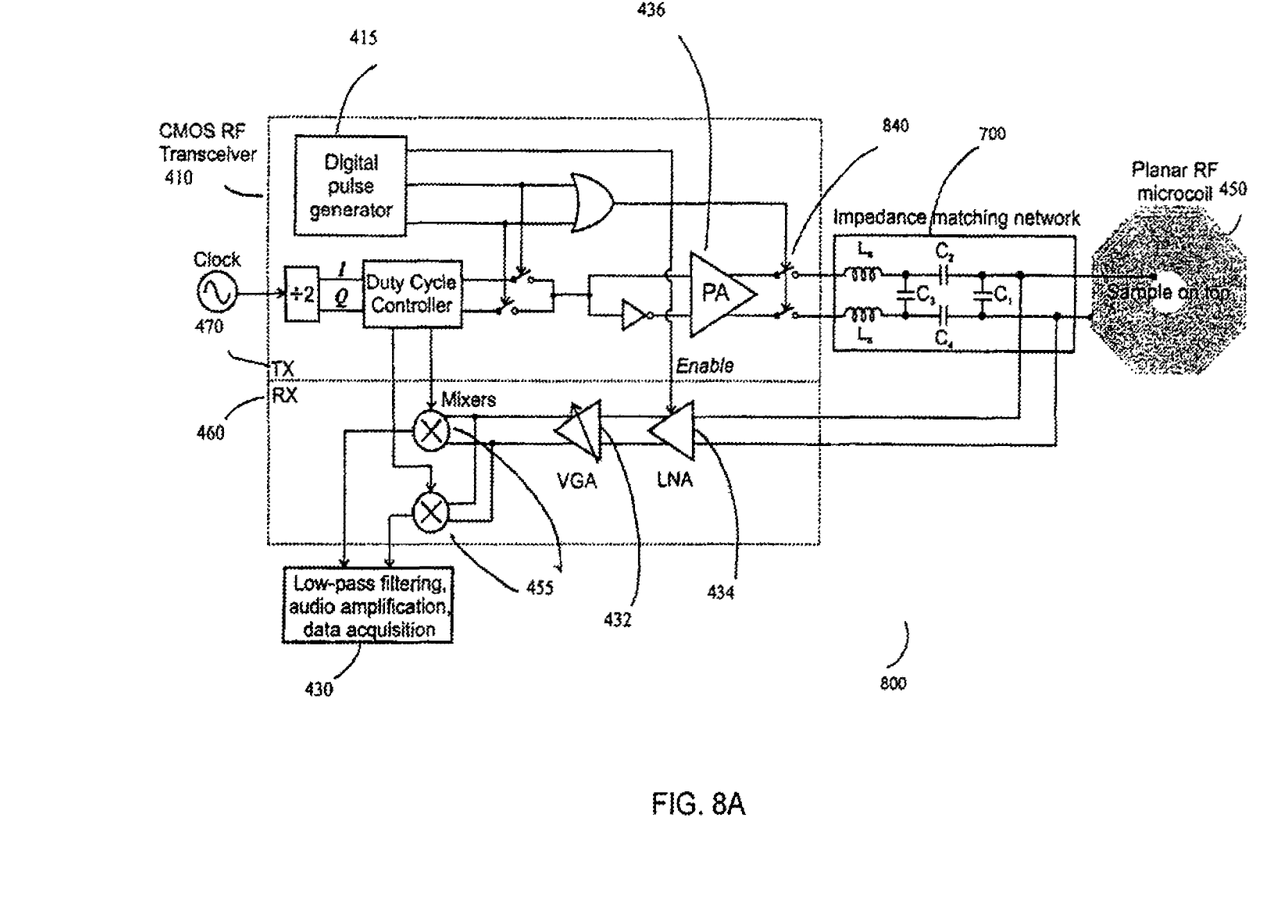
FIGS. 8A, 8B, and 8C illustrate simultaneous power matching (during the transmitter mode) and noise matching (during the receiver mode) by the impedance matching network illustrated in FIG. 7.
Figure 8B:
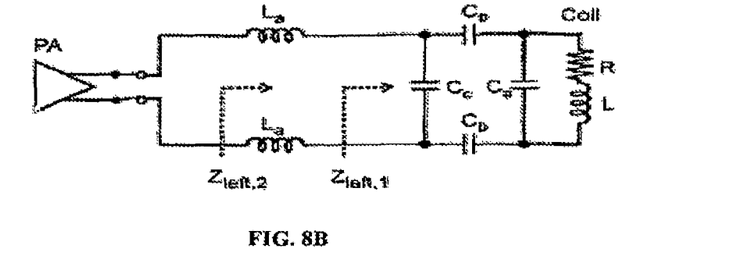
Figure 8C:
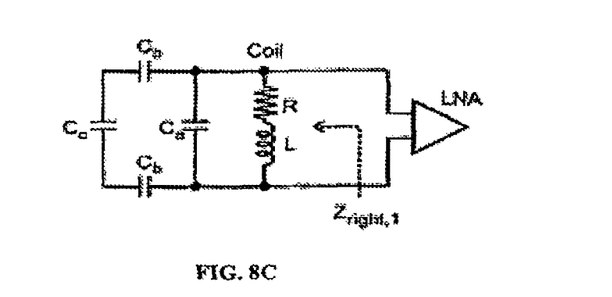

FIGS. 8A, 8B, and 8C illustrate simultaneous power matching (during the transmitter mode) and noise matching (during the receiver mode) by the impedance matching network 700 illustrated in FIG. 7.

FIG. 8A illustrates a CMOS integrated transceiver in which the impedance matching network 700 illustrated in FIG. 7 is used to perform simultaneous power matching (during the transmitter mode) and noise matching (during the receiver mode). As seen in FIG. 8A, in the transmission mode the switches 840 next to the PA 436 are turned on, and the PA 436 is connected to the coil 450 through the inductors ($L_a$) and capacitors ($C_a$, $C_b$ and $C_c$) in the illustrated embodiment. The transmission mode of the circuit illustrated in FIG. 8A is shown in FIG. 8B.

In the receiving mode in FIG. 8A, the switches 840 are off, effectively making the inductors ($L_a$) disappear, and the LNA 434 is connected to the coil 450, whose impedance is modified by the capacitors ($C_a$, $C_b$, $C_c$). The reception mode of the circuit illustrated in FIG. 8A is shown in FIG. 8C. Because neither lossy switches nor lossy inductors are present in the receiving mode, as seen in FIG. 8C, the matching network 700 hardly degrades the receiver noise figure.

As shown in FIGS. 8A, 8B, and 8C, the LNA 434 in the receiving mode and the PA 436 in the transmitting mode see two different impedances. In other words, $Z_{left,2}$, shown in FIG. 8B, is different from $Z_{right,1}$, shown in FIG. 8C. Thus, one can choose appropriate capacitor and inductor values, in order to provide power matching for the PA 436 and noise matching for the LNA 434. The difference between $Z_{left,2}$ and $Z_{right,1}$ does not arise merely from the fact that the transmitting path has additional inductors, but also from the fact that the impedance of the network of capacitors and the coil seen from the left is completely different from that seen from the right, that is, $Z_{left,1}$ (shown in FIG. 8B) is not equal to $Z_{right,1}$ (shown in FIG. 8C).

In the embodiment illustrated in FIGS. 8A, 8B, and 8C, simultaneous noise and power matching may thus be achieved by quantitative selection of the capacitor and inductor values. The impedance matching network 700 may be coupled to, or may include, a microcontroller or microprocessing system (not shown), which inter alia may be configured to adjust one or more of the first, second, third and fourth capacitors, as well as the two inductors, during the transmitter mode so as to match an impedance of the NMR coil impedance to a driver resistance of the NMR system. The microcontroller or microprocessing system may be further configured to adjust one or more of the first, second, third and fourth capacitors, as well as the two inductors, during the receiver mode so as to maximize signal-to-noise ratio.

In one exemplary embodiment, simultaneous noise and power matching in the circuit shown in FIG. 8A may be achieved by performing quantitative selection of the capacitor and inductor values in the following manner. For simplicity, the following notation may be used:

$$X_L = \omega_L L_r, X_a = -1/(\omega_L C_a), X_b = 1/(\omega_L C_b), \text{ and } Xc = -1/(\omega_L C_c).$$

$Z_{right,1}$ in FIG. 8C is given by $$Z_{right,1} = (R + jX_L) \| jX_a \| (2jX_b + jX_c)$$

$$= (R + jX_L) \| j\frac{X_a(2X_b + X_c)}{X_a + 2X_b + X_c}$$

In other words, when seen from the coil, the capacitors in FIG. 8C behave like one effective capacitor, whose impedance is to the right of the ||symbol. The noise matching condition for Q>>1 is that the effective capacitor resonates with L at $\omega_L$. This condition may be written as $$X_L + \frac{X_a(2X_b + X_c)}{X_a + 2X_b + X_c} = 0$$

In the transmitting mode, $Z_{left,1}$ shown in FIG. 8B may be expressed as:

$$Z_{left,1} = jX_x \| [2jX_b + jX_a \| (R + jX_L)]$$

$$= \frac{(X_a X_c)^2}{R(X_a + 2X_b + X_c)^2} + j\frac{(X_a + 2X_b)X_c}{X_a + 2X_b + X_c}$$

For power matching, the real part of $Z_{left,1}$ should equal the output resistance $R_{PA}$ of the PA, while its capacitive reactance is to be resonated out by the inductors La:

$$2\omega_L L_a + \frac{(X_a + 2X_b)X_c}{X_a + 2X_b + X_c} = 0$$

$$\frac{(X_a X_c)^2}{R(X_a + 2X_b + X_c)^2} = R_{PA}$$

If the above three conditions are simultaneously met, noise and power matching are simultaneously obtained. Since there are four unknown design parameters ($C_a$, $C_b$, $C_c$, and $L_a$), a large degree of freedom is available in choosing them.

While one example has been described of a quantitative selection of the capacitor and inductor values in the impedance matching network 700, other embodiments may use different processes to select or adjust the capacitor and inductor values.

In the illustrated embodiments, a method is described for performing both power matching and noise matching in an NMR system. During a transmission mode of the NMR transceiver, the impedance matching network is connected to the transmitter portion, for example to a power amplifier in the transmitter portion, and matching impedance of the coil to the driver resistance of the NMR transceiver. During a receiver mode of the NMR transceiver, the impedance matching network is disconnected from the transmitter portion so that the impedance matching network remains connected only to the receiver portion. Signal-to-noise ratio in the received NMR signals is then maximized, during the receiver mode.

In sum, systems and methods have been described for optimally performing both power matching and noise matching in the NMR system. The driving of the NMR coil is separated from the receiving path, so that when the coil is driven, the network is matched to the driver resistance, while when the NMR signal is received, the coil is at resonance and the driving path is open. Simultaneous power matching and noise matching can be achieved without using any active device(s), without generating noise or running into stability issues, and without encountering overload or overdrive problems.

Any type of computer or processing system may be used to implement the methods, systems, and algorithms described in the present disclosure, including but not limited to general purpose processors, PCs, and workstations. The methods and systems in the present disclosure are not described with reference to any particular programming language. It will be appreciated that a variety of platforms and programming languages may be used to implement the teachings of the present disclosure. The processing system (or computer) may be selectively configured and/or activated by a computer program stored therein. Such a computer program may be stored in any computer readable storage medium, including but not limited to, any type of disk including floppy disks, optical disks, CD-ROMs, and magnetic-optical disks, ROMs (read-only memories), RAMs (random access memories), EPROMs (erasable programmable read-only memories), EEPROMs (electrically erasable programmable read-only memories), magnetic or optical cards, or any type of media suitable for storing electronic instructions.

Various changes and modifications may be made to the above described embodiments. The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

The phrase "means for" when used in a claim embraces the corresponding structures and materials that have been described and their equivalents. Similarly, the phrase "step for" when used in a claim embraces the corresponding acts that have been described and their equivalents. The absence of these phrases means that the claim is not limited to any of the corresponding structures, materials, or acts or to their equivalents.

Nothing that has been stated or illustrated is intended to cause a dedication of any component, step, feature, object, benefit, advantage, or equivalent to the public, regardless of whether or not it is recited in the claims.

In short, the scope of protection is limited solely by the claims that now follow. That scope is intended to be as broad as is reasonably consistent with the language that is used in the claims and to encompass all structural and functional equivalents.

What is claimed is:

1. A system, comprising:
    an NMR (Nuclear Magnetic Resonance) coil configured to enclose a sample;
    an NMR transceiver coupled to the NMR coil, the NMR transceiver including an RF pulse generator configured to generate and apply RF pulses to the sample, thereby causing Rabi oscillation of a variable of the sample; and
    a controller configured to adjust only the duty cycle of the RF pulses, without modifying the amplitude of the RF pulses, until the energy delivered by the RF pulses is adjusted to a desired amount, thereby controlling the Rabi frequency of oscillation of the variable.

2. The system of claim 1, wherein the controller is further configured to adjust the duty cycle of the RF pulses until the energy delivered by the RF pulses at a Larmor frequency of the sample is adjusted to a desired amount.

3. The system of claim 1, wherein the RF pulses are transverse to a static magnetic field $B_0$ across the sample and the NMR coil, and further comprising a magnet configured to generate the static magnetic field $B_0$ across the sample and the NMR coil.

4. The system of claim 1, wherein the NMR transceiver is a miniaturized transceiver that is integrated onto a CMOS (Complementary Metal-Oxide Semiconductor) IC (Integrated Circuit).

5. A method of using an NMR system comprising:
   generating and applying an excitation field to a sample, thereby causing a Rabi oscillation of a variable of the sample;
   adjusting only the duty cycle of the excitation field, without modifying the amplitude of the excitation field, until the energy delivered by the excitation field is adjusted to a desired amount, thereby controlling a Rabi frequency of oscillation of the variable.

6. The method of claim 5, wherein the variable comprises a net magnetization vector of nuclei with the sample, the spin system comprises an NMR system that includes an NMR coil that surrounds the sample, and wherein the excitation field comprises RF pulses that are transverse to a static magnetic field that is applied across the sample and the NMR coil.

7. The system of claim 1, wherein the controller comprises:
   a processing system; and
   non-transitory computer-usable medium having stored therein computer-readable instructions for the processing system, wherein the instructions when executed by the processing system, cause the processing system to:
   modify the duty cycle of the RF pulses, while not modifying the amplitudes of the RF pulses, until the energy delivered by the RF pulses to the sample, at the Larmor frequency for the sample, is adjusted to a desired amount.

8. The system of claim 1, wherein the variable comprises a net magnetization vector of nuclei within the sample.

9. The system of claim 1, further comprising an impedance impedance matching network between the NMR coil and the NMR transceiver, the impedance matching network comprising:
   a first capacitor connected in parallel with the NMR coil and a second adjustable capacitor; and
   a third capacitor connected in parallel with the NMR coil and a fourth adjustable capacitor;
   wherein the impedance matching network is couplable to the NMR coil through a circuit component; and
   wherein the circuit component is configured to alternately couple the impedance matching network to a receiver portion of the NMR transceiver and a transmitter portion of the NMR transceiver, respectively.

\* \* \* \* \*